(12) United States Patent
Hao

(10) Patent No.: US 10,985,783 B1
(45) Date of Patent: Apr. 20, 2021

(54) CORRECTION DEVICE

(71) Applicant: NANYA TECHNOLOGY CORPORATION, New Taipei (TW)

(72) Inventor: Chung-Peng Hao, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/583,284

(22) Filed: Sep. 26, 2019

(51) Int. Cl.
H03M 13/00 (2006.01)
H03K 19/094 (2006.01)
H03M 13/49 (2006.01)

(52) U.S. Cl.
CPC .. *H03M 13/6575* (2013.01); *H03K 19/09425* (2013.01); *H03M 13/49* (2013.01)

(58) Field of Classification Search
CPC .............. H03M 13/6575; H03M 13/49; H03K 19/09425
See application file for complete search history.

(56) References Cited

U.S. PATENT DOCUMENTS

2012/0153987 A1* 6/2012 Cauli .................... H03K 5/1252
326/22
2017/0117901 A1* 4/2017 Carmean ................ H03K 3/037

\* cited by examiner

*Primary Examiner* — Thien Nguyen
(74) *Attorney, Agent, or Firm* — CKC & Partners Co., LLC

(57) ABSTRACT

The present disclosure provides a circuit. The circuit includes a detection circuit, a correction circuit and an adjustment circuit. The detection circuit is configured to detect an initial logic state of an input signal, and to generate, in response to the initial logic state, a first signal with a first logic state. The correction circuit is configured to compare the first signal having the first logic state with a second signal having a second logic state, and to generate an enable signal according to the comparison. The adjustment circuit is configured to be enabled by the enable signal when the first logic state of the first signal is different from the second logic state of the second signal, to generate an adjustment signal to the detection circuit, in which the detection circuit is further configured to be adjusted according to the adjustment signal, to generate an adjusted first signal.

20 Claims, 7 Drawing Sheets

CORRECTION DEVICE

BACKGROUND

The detection circuit for determining a logic state of the input signal has been widely used in logic or mixed signal circuits. However, detection conducted by the detection circuit may issue some errors due to various factors such as fluctuation of the manufacture process or improper circuit design. It causes that the high logic state of the input signal is incorrectly determined as the low logic state or the low logic state of the input signal is incorrectly determined as the high logic state.

SUMMARY

According to one embodiment of the present disclosure, the present disclosure provides a circuit. The circuit includes a detection circuit, a correction circuit and an adjustment circuit. The detection circuit is configured to detect an initial logic state of an input signal, and configured to generate, in response to the initial logic state, a first signal with a first logic state. The correction circuit is configured to compare the first signal having the first logic state with a second signal having a second logic state received by the correction circuit, and the correction circuit is configured to generate an enable signal according to the comparison, in which the second logic state of the second signal has the same logic state as the initial logic state of the input signal. The adjustment circuit is configured to be enabled by the enable signal when the first logic state of the first signal is different from the second logic state of the second signal, to generate an adjustment signal to the detection circuit, in which the detection circuit is further configured to be adjusted according to the adjustment signal, to generate an adjusted first signal.

According to another embodiment of the present disclosure, the present disclosure provides a method for correcting a logic state of an input signal of a logic circuit. The method includes the following operations: detecting, by a detection circuit, an initial logic state of an input signal; generating, by the detection circuit, a first signal with a first logic state corresponding to the initial logic state; calculating, by a coder circuit, a logic difference between the first logic state of the first signal and a second logic state that is the same as the initial logic state of the input signal; and adjusting, by a plurality of first transistors and a plurality of second transistors, according to the logic difference, a transition voltage of a transition circuit of the detection circuit by an adjustment voltage, in which the first logic state of the first signal is configured to be modified according to the transition voltage.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
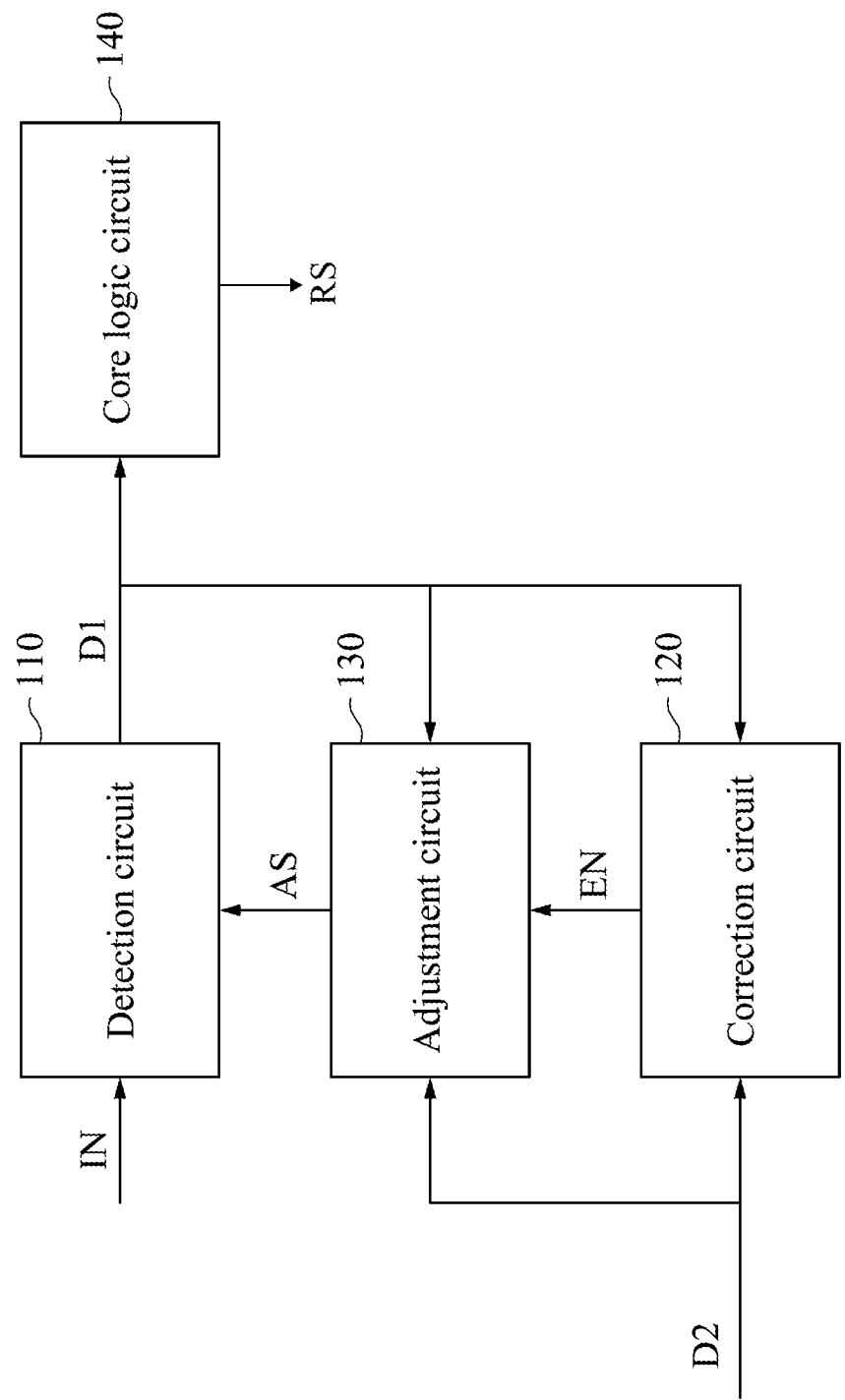
FIG. 1 is a block schematic diagram of a circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between some embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to some embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

The terms "comprise," "comprising," "include," "including," "has," "having," etc. used in this specification are open-ended and mean "comprises but not limited."

In this document, the term "coupled" may also be termed "electrically coupled," and the term "connected" may be termed "electrically connected." "Coupled" and "connected" may also be used to indicate that two or more elements cooperate or interact with each other.

Reference is made to FIG. 1. FIG. 1 is a block schematic diagram of a device 10, in accordance with some embodiments of the present disclosure. As illustratively shown in FIG. 1, the device 10 includes a detection circuit 110, a correction circuit 120, an adjustment circuit 130, and a core logic circuit 140. For illustration, the detection circuit 110 is coupled to the correction circuit 120, the adjustment circuit 130 and the core logic circuit 140. The adjustment circuit 130 is coupled between the detection circuit 110 and the correction circuit 120.

In some embodiments, the device 10 and the following device 70 and device 80 can be a Dynamic random access memory (DRAM) or any other digital circuit and analog circuit, or mixed signal circuit. But the present disclosure is not limited thereto.

The detection circuit 110 is configured to detect the logic state of the input signal IN and to generate a first signal D1 accordingly. The correction circuit 120 is configured to compare the first signal D1 with a second signal received by the correction circuit 120, and to generate an enable signal EN when a first logic state of the first signal D1 is different with a second logic state of the second signal D2. The adjustment circuit 130 is configured to be enabled by the enable signal EN to generate a switch signal, and to generate an adjustment signal AS for adjusting the detection circuit 110.

Figure 2:
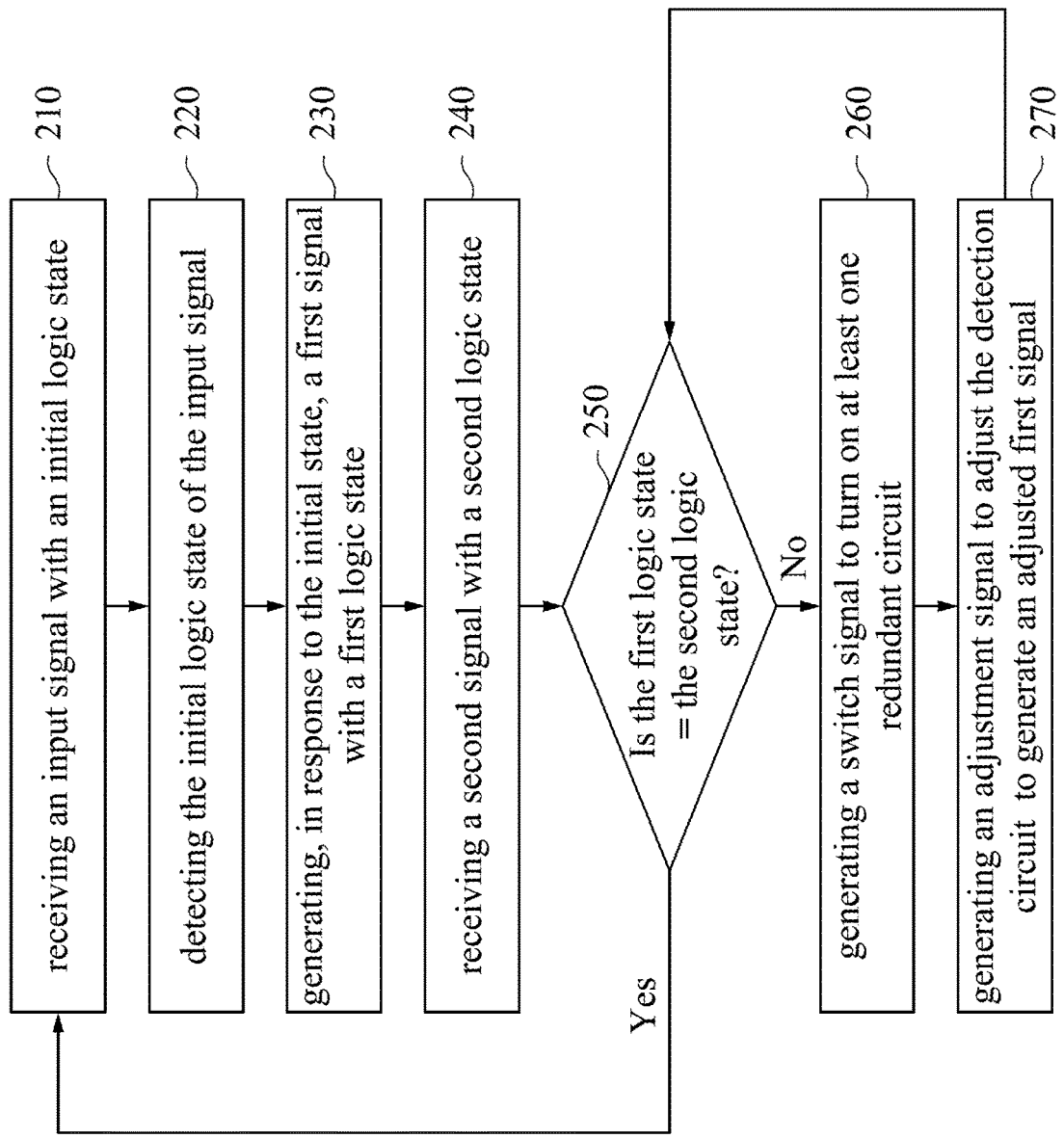
FIG. 2 is a flow chart of a method illustrating operations of the circuit in FIG. 1, in accordance with some embodiments of the present disclosure.

Reference is now made to FIG. 2. FIG. 2 is a flow chart of a method 20 illustrating operations of the device 10 in FIG. 1, in accordance with some embodiments of the present disclosure. In various embodiments of the present disclosure, method 20 can be operated on the device 70 in FIG. 7 and/or the device 80 in FIG. 8.

Please refer to FIG. 1 and FIG. 2 together. In step 210 of the method 20, for illustration, as shown in FIG. 1, the detection circuit 110 receives an input signal IN having an initial logic state. For example, the input signal can be a signal having a high voltage level of 1.8 Volts or a low voltage level of 1.0 Volts. When the detection circuit 110 operates with a certain threshold voltage, for example, 1.5 Volts, then the logic state of the signal having the voltage level of 1.8 Volts can be referred as a high logic state (logic 1), and the logic state of the signal having the voltage level of 1.0 Volts can be referred as a low logic state (logic 0). Moreover, in some other embodiments, when the detection circuit 110 operates with another threshold voltage, for example, 2.0 Volts, then both of the logic states of the signal having the voltage level of 1.8 Volts and one having the voltage level of 1.0 Volts can be referred as low logic states. The voltage value and the corresponding logic state here are given for illustrative purposes, and can be any value depending on the actual implementations. The present disclosure is not limited thereto.

In step 220, the detection circuit 110 detects the logic state of the input signal IN. As mentioned in the above embodiments, the initial logic state, having the high logic state, detected by the detection circuit 110, is a high logic state. Similarly, the initial logic state, having the low logic state, detected by the detection circuit 110, is a low logic state.

Afterwards, in step 230, the detection circuit 110 generates, in response to the initial state of the input signal IN, a first signal D1 with a first logic state. For instance, as the embodiments aforementioned, the detection circuit 110 generates the first signal D1 with the first logic state, which is high logic state, in response to the initial state having the high logic state. Similarly, the detection circuit 110 generates the first signal D1 with the first logic state, which is a low logic state, in response to the initial state having the low logic state.

In step 240, the correction circuit 120 receives a second signal D2 with a second logic state. In some embodiments, the input signal IN is also sent to the correction circuit 120 as the second signal D2, in which the second signal D2 has a logic state being the same as the initial logic state of the input signal IN. In some other embodiments, the core logic circuit 140 coupled to an output of the detection circuit no is configured to output a reference signal RS as the second signal D2. For example, the core logic circuit 140 is designed to operate with a signal having a high logic state, and correspondingly the core logic circuit 140 outputs the reference signal RS having a high logic state as the second signal D2 to the correction circuit 120. The logic state of the second signal D2 and the reference signal RS here is given for illustrative purposes, but the present disclosure is not limited thereto.

Moreover, in step 250, the correction circuit 120 compares the first signal D1 having the first logic state with the second signal D2 having a second logic state, and generates the enable signal EN, according to the comparison, to enable the adjustment circuit 130. Alternatively stated, the correction circuit 120 determines whether the first logic state of the first signal D1 is the same as the second logic state of the second signal D2. For example, when the first logic state of the first signal D1 is the same as the second logic state of the second signal D2 (i.e., the first signal D1 and the second signal D2 both have a high logic state or the first signal D1 and the second signal D2 both have a low logic state), in some embodiments, the first signal D1 is sent to the core logic circuit 140 and step 210 is performed. In other words, when the first logic state of the first signal D1 has the same logic state as the second logic state of the second signal D2, the correction circuit 120 is further configured to disable the adjustment circuit 130. However, when the first logic state of the first signal D1 is different from the second logic state of the second signal D2 (i.e., the first signal D1 has a high logic state and the second signal D2 has a low logic state or the first signal D1 has a low logic state and the second signal D2 has a high logic state), the correction circuit 120 generates the enable signal EN to enable the adjustment circuit 130 and step 260 is performed.

In addition, according to the step 260, the adjustment circuit 130 enabled by the enable signal EN when the first logic state of the first signal D1 is different from the second logic state of the second signal D2, to generate a switch signal to turn on at least one redundant circuit in the adjustment circuit 130. For example, in some embodiments, the adjustment circuit 130 calculates a logic difference between the first logic state (i.e., logic 1) of the first signal D1 and the second logic state (i.e., logic 0) of the second signal D2, the logic difference being "1", and the adjustment circuit 130 correspondingly generates the switch signal to compensate the logic difference. The detail operation of the adjustment circuit 130 will be discussed in the following paragraph.

After step 260 is performed, in step 270, the adjustment circuit 130 is enabled to generate an adjustment signal AS to the detection circuit 110. Furthermore, the detection circuit 110 is configured to be adjusted according to the adjustment signal AS to generate an adjusted first signal D1 and then step 250 is performed. For example, as the aforementioned embodiments (i.e., the first logic state of the first signal D1 being logic 1 and the second logic state of the second signal D2 being logic 0), the detection circuit 110 is adjusted in response to the adjustment signal AS and generates the adjusted first signal D1 having a logic state which is logic 0. Thereafter step 250 is performed to determine that the first logic state of the adjusted first signal D1 is the same as the second logic state of the second signal D2. Alternatively stated, the detection circuit 110 outputs the correct first signal D1, whose logic state is the same as the initial logic state of the input signal IN, to the core logic circuit 140 for further applications. However, in some other embodiments, after step 270 and step 250 are performed, the logic state of the adjusted first signal D1 is still determined, by the correction circuit 120, being different from the second logic state of the second signal D2, the step 260, 250 and 270 are performed in order until the first logic state of the first signal D1 is the same as the second logic state of the second signal D2.

The arrangements of embodiments of the circuits described above will be illustrated in the following paragraph, but the present disclosure is not limited thereto.

Figure 3:
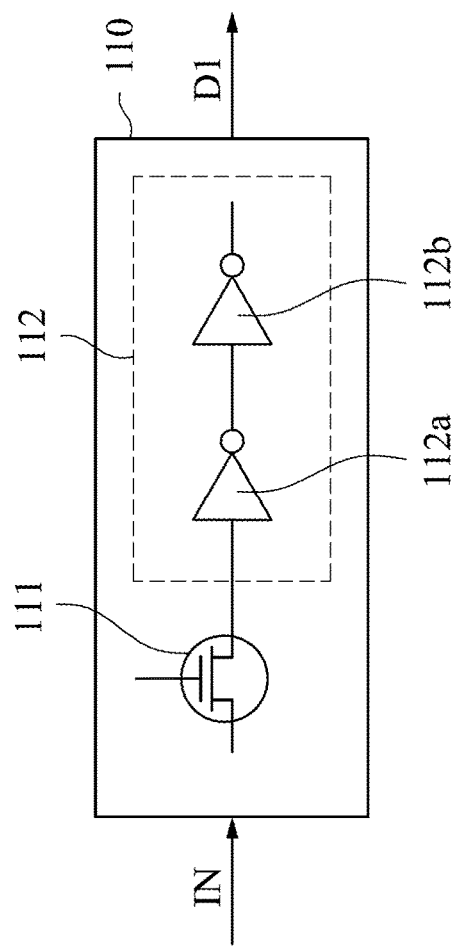
FIG. 3 is a block schematic diagram of a detection circuit of the circuit in FIG. 1, in accordance with some embodiments of the present disclosure.

Reference is now made to FIG. 3. FIG. 3 is a block schematic diagram of a detection circuit 110 of the circuit in FIG. 1, in accordance with some embodiments of the present disclosure. For ease of understanding, the similar elements in FIG. 1 and FIG. 3 will be designated with the same reference numbers.

As illustratively in FIG. 3, the detection circuit 110 includes a switch 111 and a transition circuit 112. A terminal of the switch 111 is coupled to the transition circuit 112. In some embodiments, the transition circuit 112 includes an inverter 112a and an inverter 112b. The switch 111 is configured to receive the input signal IN at a terminal, in response to a control signal received through a gate terminal of the switch 111. The transition circuit 112 is configured to receive the input signal IN from the switch 111 and to transit the initial logic state of the input signal IN to generate the first signal D1. Specifically, in some embodiments, after receiving the input signal IN having logic state 0, the transition circuit 112 outputs the first signal having logic state 0. Alternatively, the transition circuit 112 outputs the first signal having logic state 1 in response to the received input signal IN having logic state 1. To illustrate in detail, according to the aforementioned embodiment, the inverter 112a operating with voltage VDD, being 1.8 Volts, outputs a signal with 1.8 Volts (logic state 1), in response to the input signal with 0 Volts (logic state 0), to the inverter 112b. Then, the inverter 112b operating with voltage VDD, being 1.0 Volts, outputs a signal with 0 Volts (logic state 0), in response to the signal received from the inverter 112a. Alternatively, the inverter 112a operating with voltage VDD, being 1.8 Volts, outputs a signal with 0 Volt (logic state 0), in response to the input signal with 1.8 Volts (logic state 1), to the inverter 112b. Then, the inverter 112b operating with voltage VDD, being 1.0 Volts, outputs a signal with 1.0 Volts (logic state 1), in response to the signal received from the inverter 112a. Furthermore, in some embodiments, at least one pull-up transistor and at least one pull-down transistor are coupled to in parallel, at drain terminals of the at least one pull-up transistor and the at least one pull-down transistor, the output of the inverter 112a or the output of the inverter 112b. The detail of the operation of the at least one pull-up transistor and the at least one pull-down transistor will be discussed in the following paragraph. The value of voltage VDD, the logic state of the inverter and the output signal and the configurations of the inverters, the at least one pull-up transistor and the at least one pull-down transistor are given for illustrative purposes, but the present disclosure is not limited thereto.

Figure 4:
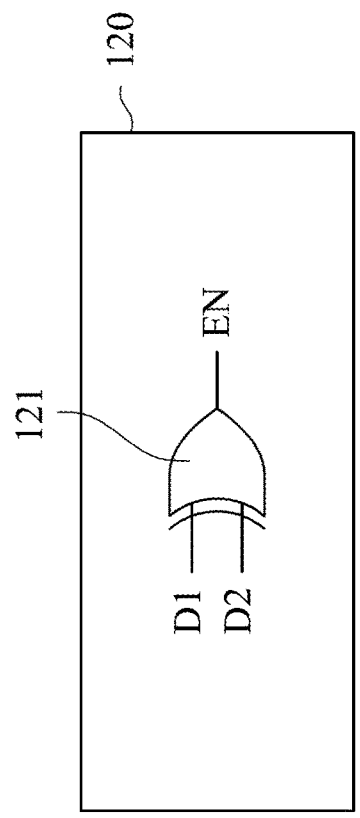
FIG. 4 is a block schematic diagram of a correction circuit of the circuit in FIG. 1, in accordance with some embodiments of the present disclosure.

Reference is now made to FIG. 4. FIG. 4 is a block schematic diagram of the correction circuit 120 of the device 10 in FIG. 1, in accordance with some embodiments of the present disclosure. As shown in FIG. 4, the correction circuit 120 includes an exclusive-OR gate 121 being configured to perform an XOR operation of the first signal D1 and the second signal D2, and to output the enable signal EN in response to the XOR operation. For illustration, in some embodiments, when the first signal D1 has logic state 1 and the second signal D2 has logic state 1, the exclusive-OR gate 121 outputs the enable signal EN having logic state 0 which is configured to disable the adjustment circuit 130. Alternatively, when the logic state of the first signal D1 is different from the logic state of the second signal D2, for example, first signal D1 having logic state 1 and the second signal D2 having logic state 0, the exclusive-OR gate 121 outputs the enable signal EN having logic state 1 which is configured to enable the adjustment circuit 130.

Figure 5:
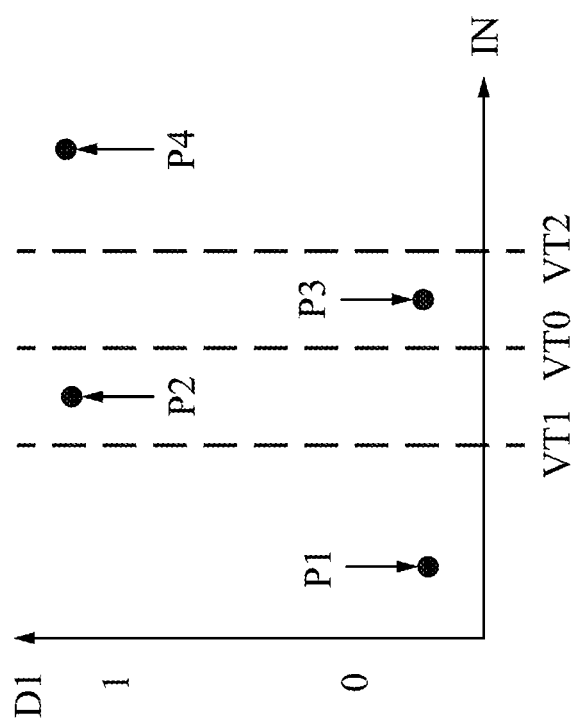
FIG. 5 is a graph of a voltage of the input signal and a logic state of the first signal, in accordance with some embodiments of the present disclosure.

Reference is now made to FIG. 5. FIG. 5 is a graph of a voltage of the input signal IN and a logic state of the first signal D1, in accordance with some embodiments of the present disclosure. As shown in FIG. 5, the points P1, P2, P3 and P4 represent the logic states of the first signal D1 corresponding to the input signal IN having certain voltage values. For illustration, in some embodiments of the regular operation of the transition circuit 112, when the input signal IN has a voltage below or above a transition voltage VT0, the transition circuit 112 outputs the first signal D1 with corresponding low (0) or high (1) logic state, as shown by point P1 and point P4, respectively. However, due to some unforeseen factors in the circuit such as fluctuation of manufacture process or improper circuit design, in some embodiments, the transition voltage of the transition circuit 112 is changed and different from the default setting. For instance, as the transition voltage of the transition circuit 112 becomes the transition voltage VT1 which is smaller than the transition voltage VT0, the transition circuit 112 outputs the first signal D1 with high logic state when the input signal IN has the voltage smaller the transition voltage VT0 (i.e., the logic state of the input signal IN is low (0) which is the same as the logic state of the second signal D2), as shown by point 2. Similarly, in some other embodiments, as the transition voltage of the transition circuit 112 becomes the transition voltage VT2 which is larger the transition voltage VT0, the transition circuit 112 output the first signal D1 with low logic state when the input signal has the voltage larger the transition voltage VT0 (i.e., the logic state of the input signal IN is high (1) which is the same as the logic state of the second signal D2), as shown by point 3.

As stated above, in such cases, when the logic state of the first signal D1 is different from the logic state of the second signal D2, the adjustment circuit 130 is further configured to generate an adjustment voltage ΔV as the adjustment signal AS to be applied on the transition voltage of the transition circuit 112. The adjustment voltage ΔV is configured to be applied to adjust the transition voltage in order to transit the logic state of the first signal D1 from having the high logic value to having the low logic value or from having the low logic value to having the high logic value. Taking the situation illustrated by point 2 as an example, in the embodiments, the positive adjustment voltage ΔV is applied to the transition voltage of the transition circuit 112 to increase the transition voltage such that the voltage of the input signal IN can be below the transition voltage and the adjusted first signal D1 having low logic state can be generated. By the same token, in the embodiments illustrated by point 3, the negative adjustment voltage ΔV is applied to the transition voltage of the transition circuit 112 to decrease the transition voltage such that the voltage of the input signal IN can be below the transition voltage and the adjusted first signal D1 having low logic state can be generated.

It should be noticed that the configuration of adjustment to the transition voltage of the transition circuit 112 are given for illustrative purposes. Various configuration of the transition circuit 112 are within the contemplated scope of the present disclosure. For example, in some embodiments, the transition voltage can be a threshold voltage of the inverter 112a or the inverter 112b. In such embodiment, when the logic state of the first signal D1 is high and the logic state of the second signal D2 is low, the negative adjustment voltage ΔV is applied to the transition voltage of the transition circuit 112 to decrease the transition voltage. Similarly, when the logic state of the first signal D1 is low and the logic state of the second signal D2 is high, the positive adjustment voltage ΔV is applied to the transition voltage of the transition circuit 112 to increase the transition voltage.

Figure 6:
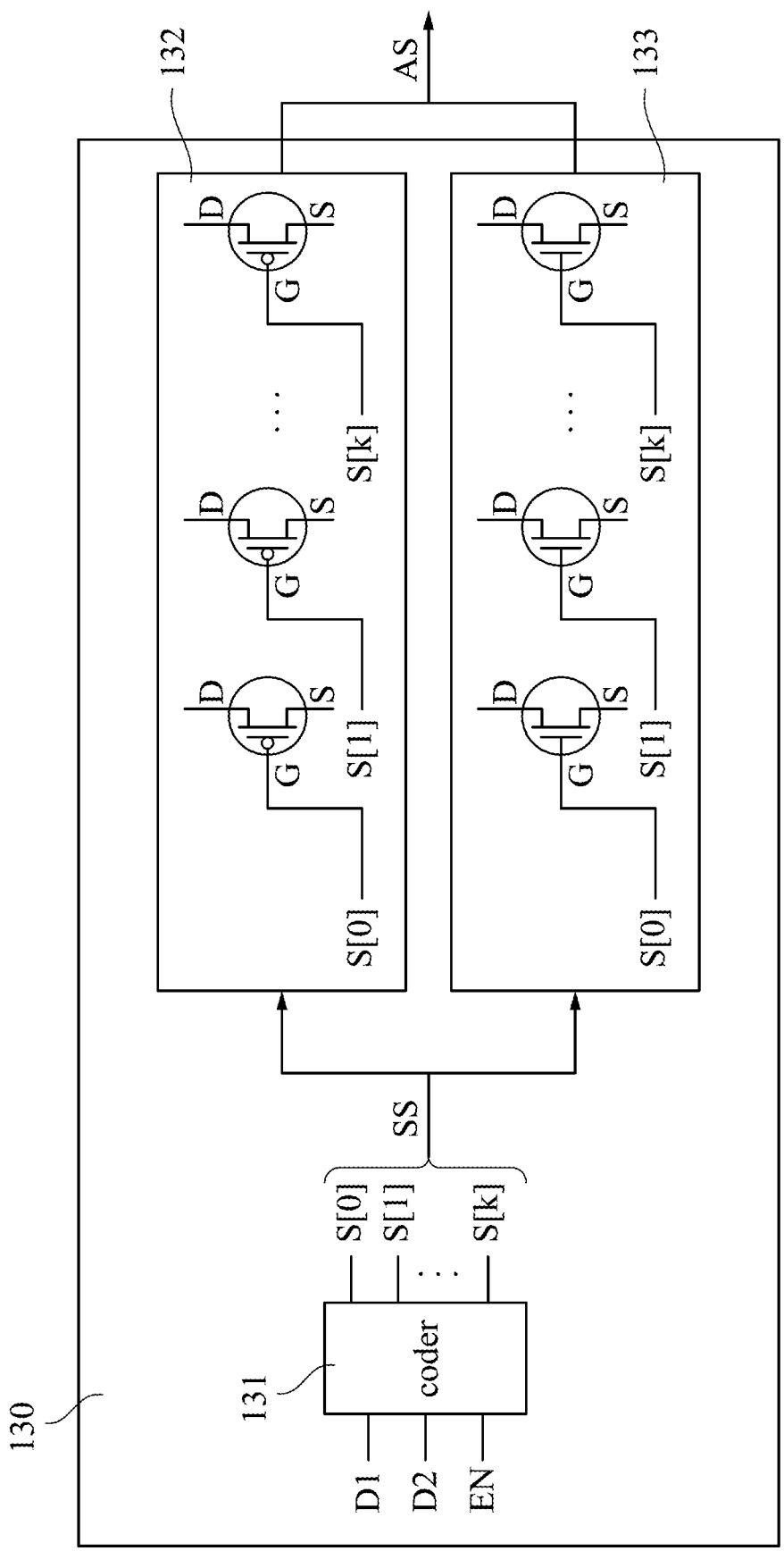
FIG. 6 is a block schematic diagram of an adjustment circuit of the circuit in FIG. 1, in accordance with some embodiments of the present disclosure.

Reference is now made to FIG. 6. FIG. 6 is a block schematic diagram of the adjustment circuit 130 of the device 10 in FIG. 1, in accordance with some embodiments of the present disclosure. As shown in FIG. 6, the adjustment circuit 130 includes a coder 131, a pull-up circuit 132 and a pull-down circuit 133. The pull-up circuit 132 includes at least one pull-up transistor and the pull-down circuit 133 includes at least one pull-down transistor. In some embodiments, the at least one pull-up transistor is an at least one p-type field effect transistor and the at least one pull-down transistor is an at least one n-type field effect transistor. For illustration, the adjustment circuit 130 is configured to adjust the transition circuit 112, by applying the adjustment voltage ΔV as the adjustment signal AS, in order to modify the first logic state of the first signal D1 when the logic state of first signal D1 and the second signal D2 are different from each other, the enable signal EN having a logic state 1. The coder 131 is configured to generate a switch signal SS in response to the first signal D1, the second signal D2 and the enable signal EN. In some embodiments, the coder 131 can be any circuit implemented as a coder. The pull-up circuit 132 and the pull-down circuit 133 are configured to be switched on or off, in response to the switch signal SS, to generate the adjustment voltage ΔV. In some embodiments of the present disclosure, the transition voltage VT in one operation and the adjustment voltage ΔV are expressed as the equation (1) and (2) below:

$$VT(n)=VT(n-1)+\Delta V \quad (1)$$

$$\Delta V=\Delta W \times VT(n-1) \quad (2)$$

$$\Delta W=\eta \times (Yi-Qi) \quad (3)$$

$$\Delta W=\eta \times (Qi-Yi) \quad (4)$$

VT(n) is the transition voltage after being applying the adjustment voltage ΔV to the transition voltage VT(n−1) in the previous operation. η is a default learning rate. Qi is the logic state of the first signal D1. Yi is the logic state of the second signal D2. ΔW is a weighting factor.

As shown in equation (2), the adjustment voltage ΔV is dependent on the transition voltage of the transition circuit 112, and the adjustment voltage ΔV equals to the transition voltage multiplied by the weighting factor ΔW. Furthermore, as shown in equation (3) and equation (4), the coder 131 is configured to calculate a logic difference between the logic state Qi of the first signal D1 and the logic state Yi of the second signal D2. It should be noted that, when the inverter 112b operated with error, equation (3) is applied in the coder 131 for calculation. Conversely, when the inverter 112a operated with error, equation (4) is applied. Correspondingly, in some embodiments, according to the logic difference, the transition voltage of a transition circuit 112 of the detection circuit 110 is adjusted by transistors of the pull-up circuit 132 and/or transistors of the pull-down circuit 133 with the adjustment voltage ΔV as the adjustment signal AS. Thereafter an adjusted first signal D1 is generated by the detection circuit 110 after determining that the first logic state of the first signal is different from the second logic state.

Specifically, for example, in some embodiments, when the logic state Qi of the first signal D1 is 1 and the logic state of the second signal D2 is 0, the logic difference between the first signal D1 and the second signal D2 is −1 (that is, based on equation (3), Yi as 0 minus Qi as 1 equals to −1). The pull-up circuit 132 and the pull-down circuit 133 are coupled to the output of the inverter 112b, while the inverter 112b having the transition voltage VT(0) does not invert the logic state 1, received from the inverter 112a, into logic state 0. η is 0.1 by default. Firstly, the coder 131 generates the switch signal SS with S[0]=1 while S[1]–S[k]=0. Accordingly, the first n-type transistor is turned on and generates negative adjustment voltage ΔV, applied on the transition voltage VT(0), ΔW=−0.1 while one pull-down transistor is turned on. After the first operation, if the logic difference between the first signal D1 and the second signal D2 remains −1, the coder 131 generates the switch signal SS with S[0]–S[1]=1 while S[2]–S[k]=0. Accordingly, the first and second n-type transistors are turned on and generate negative adjustment voltage ΔV, applied on the transition voltage VT(1), ΔW=−0.2 while two pull-down transistors are turned on. After the second operation, if the logic difference between the first signal D1 and the second signal D2 remains −1, the coder 131 generates the switch signal SS with S[0]–S[2]=1 while S[3]–S[k]=0. Accordingly, the first, second and third n-type transistors are turned on and generate negative adjustment voltage ΔV, applied on the transition voltage VT(2), ΔW=−0.3 while three pull-down transistors are turned on. In other words, as long as the logic difference of the first signal D1 and the second signal D2 remains 1, the coder 131 can continuously generate switch signal SS to activate more transistors to pull-down the transition voltage of the transition circuit 112.

By the same token, for example, in another embodiment, when the logic state Qi of the first signal D1 is 0 and the logic state Yi of the second signal D2 is 1, the logic difference between the first signal D1 and the second signal D2 is 1 (that is, based on equation (3), Yi as 1 minus Qi as 0 equals to 1). The pull-up circuit 132 and the pull-down circuit 133 are coupled to the output of the inverter 112b, while the inverter 112b having the transition voltage VT(0) does not invert the logic state 0, received from the inverter 112a, into logic state 1. η is 0.1 by default. Firstly, the coder 131 generates the switch signal SS with S[0]=0 while S[1]–S[k]=1. Accordingly, the first p-type transistor is turned on and generates positive adjustment voltage ΔV, applied on the transition voltage VT(0), ΔW=0.1 while one pull-up transistor is turned on. After the first operation, if the logic difference between the first signal D1 and the second signal D2 remains 1, the coder 131 generates the switch signal SS with S[0]–S[1]=0 while S[2]–S[k]=1. Accordingly, the first and second p-type transistors are turned on and generate positive adjustment voltage ΔV, applied on the transition voltage VT(1), ΔW=0.2 while two pull-up transistors are turned on. After the second operation, if the logic difference between the first signal D1 and the second signal D2 remains 1, the coder 131 generates the switch signal SS with S[0]–S[2]=0 while S[3]–S[k]=1. Accordingly, the first, second and third p-type transistors are turned on and generate positive adjustment voltage ΔV, applied on the transition voltage VT(2), ΔW=0.3 while three pull-up transistors are turned on. In other words, as long as the logic difference of the first signal D1 and the second signal D2 remains 1, the coder 131 can continuously generate switch signal SS to activate more transistors to pull-up the transition voltage of the transition circuit 112.

Moreover, in some other embodiments, when the logic state Qi of the first signal D1 is 1 and the logic state Yi of the second signal D2 is 0, the logic difference between the first signal D1 and the second signal D2 is 1 (that is, based on equation (4), Qi as 1 minus Yi as 0 equals to 1). The pull-up circuit 132 and the pull-down circuit 133 are coupled to the output of the inverter 112a, while the inverter 112a having the transition voltage VT(0) does not invert the logic state 0, received from the switch 111, into logic state 1. η is 0.1 by default. Firstly, the coder 131 generates the switch signal SS with S[0]=0 while S[1]–S[k]=1. Accordingly, the first p-type transistor is turned on and generates positive adjustment voltage ΔV applied on the transition voltage VT(0), ΔW=0.1 while one pull-up transistor is turned on. After the first operation, if the logic difference between the first signal D1 and the second signal D2 remains 1, the coder 131 generates the switch signal SS with S[0]–S[1]=0 while S[2]–S[k]=1. Accordingly, the first and second p-type transistors are turned on and generate positive adjustment voltage ΔV, applied on the transition voltage VT(1), ΔW=0.2 while two pull-up transistors are turned on. After the second operation, if the logic difference between the first signal D1 and the second signal D2 remains 1, the coder 131 generates the switch signal SS with S[0]–S[2]=0 while S[3]–S[k]=1. Accordingly, the first, second and third p-type transistors are turned on and generate positive adjustment voltage ΔV, applied on the transition voltage VT(2), ΔW=0.3 while three pull-up transistors are turned on. In other words, as long as the logic difference of the first signal D1 and the second signal D2 remains 1, the coder 131 can continuously generate switch signal SS to activate more transistors to pull-up the transition voltage of the transition circuit 112.

Similarly, in another embodiment, when the logic state Qi of the first signal D1 is 0 and the logic state Yi of the second signal D2 is 1, the logic difference between the first signal D1 and the second signal D2 is −1 (that is, based on equation (4), Qi as 0 minus Yi as 1 equals to −1). The pull-up circuit 132 and the pull-down circuit 133 are coupled to the output of the inverter 112a, while the inverter 112a having the transition voltage VT(0) does not invert the logic state 1, received from the switch 111, into logic state 0. η is 0.1 by default. Firstly, the coder 131 generates the switch signal SS with S[0]=1 while S[1]–S[k]=0. Accordingly, the first n-type transistor is turned on and generates negative adjustment voltage ΔV, applied on the transition voltage VT(0), ΔW=−0.1 while one pull-down transistor is turned on. After the first operation, if the logic difference between the first signal D1 and the second signal D2 remains 1, the coder 131 generates the switch signal SS with S[0]–S[1]=1 while S[2]–S[k]=0. Accordingly, the first and second n-type transistors are turned on and generate negative adjustment voltage ΔV, applied on the transition voltage VT(1), ΔW=−0.2 while two pull-down transistors are turned on. After the second operation, if the logic difference between the first signal D1 and the second signal D2 remains −1, the coder 131 generates the switch signal SS with S[0]–S[2]=1 while S[3]–S[k]=0. Accordingly, the first, second and third n-type transistors are turned on and generate negative adjustment voltage ΔV, applied on the transition voltage VT(2), ΔW=−0.3 while three pull-down transistors are turned on. In other words, as long as the logic difference of the first signal D1 and the second signal D2 remains −1, the coder 131 can continuously generate switch signal SS to activate more transistors to pull-down the transition voltage of the transition circuit 112.

The configurations of switch signals, transition voltages in operations, the number of the transistors of the adjustment circuit 130 being turned on and adjustment voltage ΔV are given for illustrative purposes. Various configurations of the adjustment circuit 130 are within the contemplated scope of the present disclosure.

Figure 7:
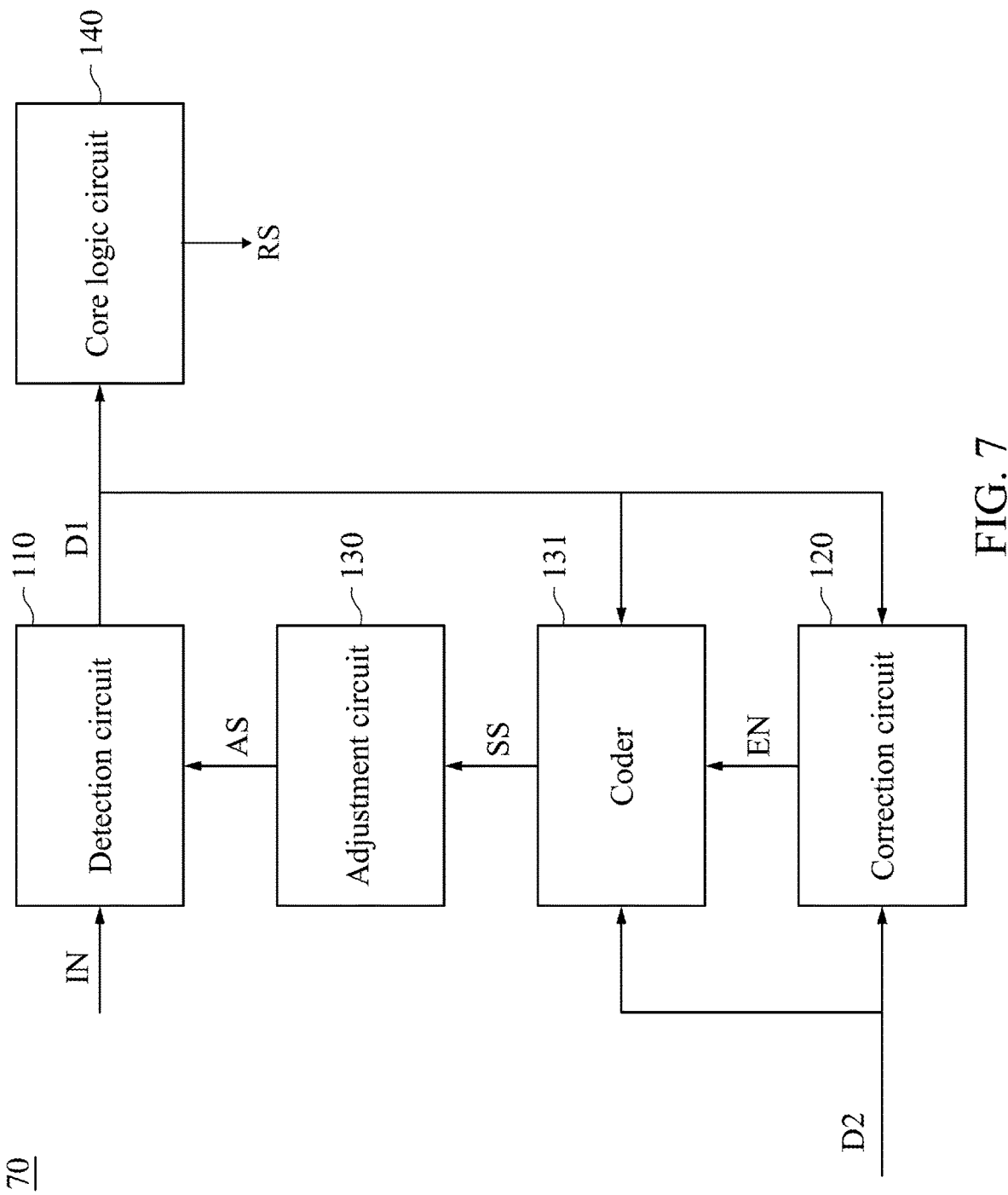
FIG. 7 is a block diagram of a circuit, in accordance with some other embodiments of the present disclosure.

Reference is now made to FIG. 7. FIG. 7 is a block diagram of a device 70, in accordance with some other embodiments of the present disclosure. With respect to the embodiments of FIG. 7, like elements in FIG. 1 and FIG. 6 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 7.

Compared to the embodiments shown in FIG. 1, the coder 131, being included in the adjustment circuit 130 as shown in FIG. 6, is now not included in the adjustment circuit 130. As shown in FIG. 7, the coder 131 is coupled between the correction circuit 120 and the adjustment circuit 130. For illustration, in such embodiment in FIG. 7, the coder 131 is enabled by the enable signal EN generated by the correction circuit, and outputs the switch signal SS to the adjustment circuit 130 to switch on or off the corresponding pull-up circuit 132 or the corresponding pull-down 133.

Figure 8:
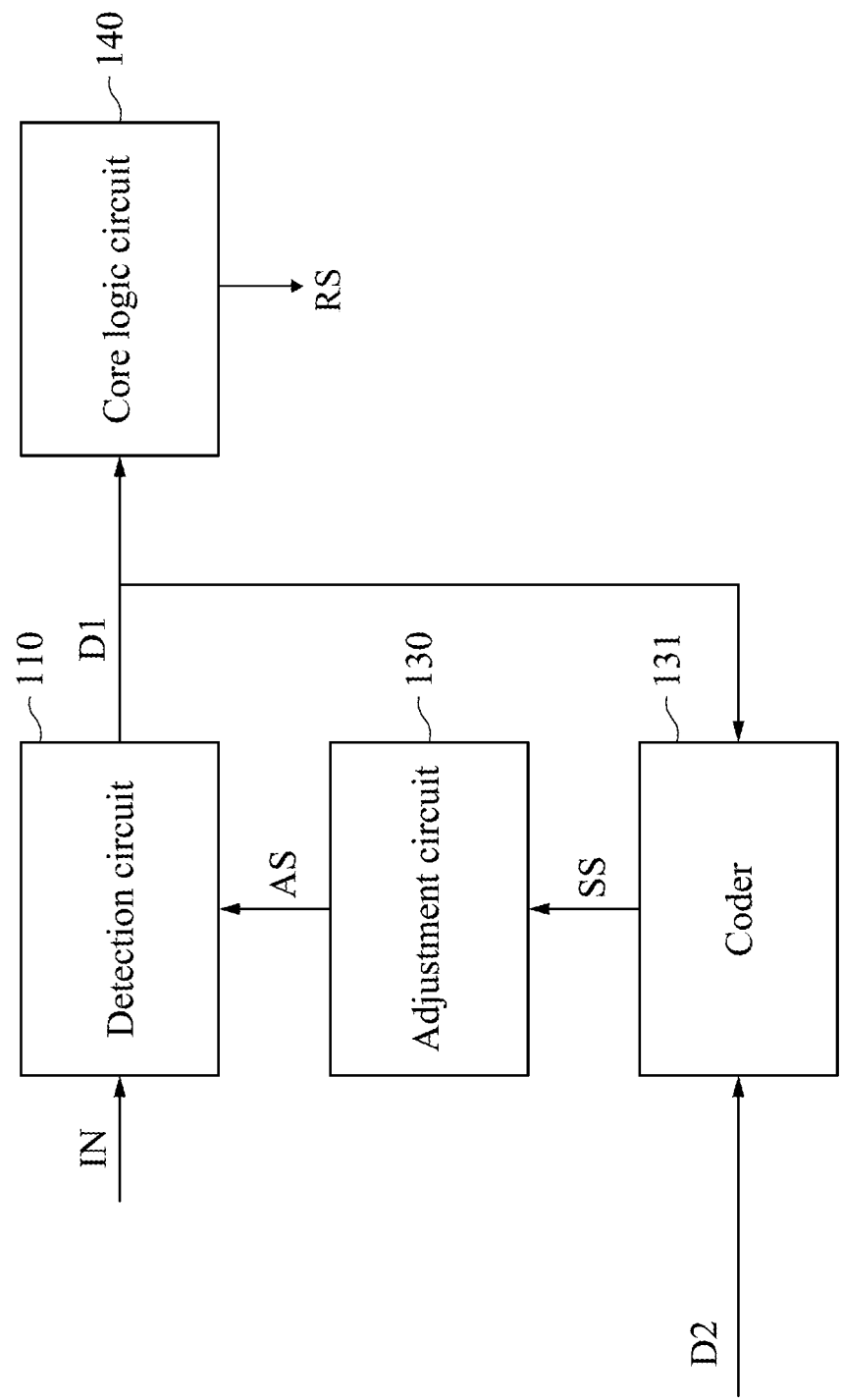
FIG. 8 is a block diagram of a circuit, in accordance with some other embodiments of the present disclosure.

Reference is now made to FIG. 8. FIG. 8 is a block diagram of a device 80, in accordance with some other embodiments of the present disclosure. With respect to the embodiments of FIG. 8, like elements in FIG. 1 and FIG. 6 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 8.

Compared to the embodiments shown in FIG. 1, the coder 131, being included in the adjustment circuit 130 as shown in FIG. 6, is now not included in the adjustment circuit 130. Furthermore, the function of the correction circuit 120 is integrated into the coder 131. As shown in FIG. 8, the coder 131 is coupled to the detection circuit, the adjustment circuit 130 and the core logic circuit. For illustration, in such embodiment in FIG. 8, the coder 131 is configured to compare the first signal D1 with the second signal D2. When the logic state of the first signal D1 is different from the logic state of the second signal D2, the coder 131 outputs the switch signal SS to the adjustment circuit 130 to switch on or off the corresponding pull-up circuit 132 or the corresponding pull-down 133.

In summary, in accordance with various embodiments of the present disclosure, by comparing the output signal of a detection circuit with a reference signal, the detection circuit can be adjusted and accordingly output an adjusted output signal having a correct logic state to a following core logic circuit.

It is noted that, the drawings, the embodiments, and the features and circuits in the various embodiments may be combined with each other as long as no contradiction appears. The circuits illustrated in the drawings are merely examples and simplified for the simplicity and the ease of understanding, but not meant to limit the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a detection circuit configured to detect an initial logic state of an input signal, and configured to generate, in response to the initial logic state, a first signal having a first logic state;
   a correction circuit configured to compare the first signal having the first logic state with a second signal having a second logic state received by the correction circuit, and the correction circuit being configured to generate an enable signal according to the comparison, wherein the second logic state of the second signal has the same logic state as the initial logic state of the input signal; and
   an adjustment circuit configured to be enabled by the enable signal when the first logic state of the first signal is different from the second logic state of the second signal, to generate an adjustment signal to the detection circuit,
   wherein the detection circuit is further configured to be adjusted according to the adjustment signal, to generate an adjusted first signal.

2. The device of claim 1, further comprising:
   a logic circuit coupled to an output of the detection circuit and configured to output a reference signal, as the second signal, to the correction circuit.

3. The device of claim 1, wherein the correction circuit comprises:
   an exclusive-OR gate configured to perform an XOR operation of the first signal and the second signal.

4. The device of claim 1, wherein
   when the first logic state of the first signal has the same logic state as the second logic state of the second signal, the correction circuit is further configured to disable the adjustment circuit.

5. The device of claim 1, wherein the detection circuit comprises:
   a transition circuit configured to transit the initial logic state of the input signal to generate the first signal,
   wherein when the first logic state of the first signal is different from the second logic state of the second signal, the adjustment circuit is further configured to generate an adjustment voltage as the adjustment signal to be applied on a transition voltage of the transition circuit.

6. The device of claim 5, wherein
   when the first logic state of the first signal has a high logic value and the second logic state of the second signal has a low logic value, the adjustment voltage is configured to be applied to adjust the transition voltage in order to transit the first logic state of the first signal from having the high logic value to having the low logic value.

7. The device of claim 5, wherein
   when the first logic state of the first signal has a low logic value and the second logic state of the second signal has a high logic value, the adjustment voltage is configured to be applied to adjust the transition voltage in order to transit the first logic state from the low logic value to the high logic value.

8. The device of claim 5, wherein
   the adjustment voltage is dependent on the transition voltage of the transition circuit.

9. The device of claim 8, wherein
   the adjustment circuit comprises at least one pull-up transistor and at least one pull-down transistor,
   wherein the at least one pull-up transistor and the at least one pull-down transistor are coupled to the detection circuit, and configured to pull up the transition voltage and pull down the transition voltage, respectively.

10. The device of claim 9, wherein the adjustment circuit further comprises:
    a coder circuit configured to generate a switch signal in response to the first signal, the second signal and the enable signal.

11. The device of claim 10, wherein
    the at least one pull-up transistor and/or the at least one pull-down transistor are further configured to be switched on or off, in response to the switch signal, to generate the adjustment voltage.

12. The device of claim 11, wherein
    the at least one pull-up transistor is an at least one p-type field effect transistor and the at least one pull-down transistor is an at least one n-type field effect transistor.

13. The device of claim 1, further comprising:
    a coder circuit configured to generate a switch signal, in response to the first signal, the second signal and the enable signal, for generating the adjustment signal.

14. The device of claim 1, wherein the detection circuit further comprises:
    a transition circuit configured to transit the initial logic state of the input signal to generate the first signal,
    wherein when the first logic state of the first signal is different from the second logic state of the second signal, the adjustment circuit is further configured to adjust the transition circuit, by the adjustment signal, in order to modify the first logic state of the first signal.

15. A method, comprising:
    detecting, by a detection circuit, an initial logic state of an input signal;
    generating, by the detection circuit, a first signal with a first logic state corresponding to the initial logic state;
    calculating, by a coder circuit, a logic difference between the first logic state of the first signal and a second logic state, of a second signal, that is the same as the initial logic state of the input signal; and
    generating, by switching on at least one of a plurality of first transistors or at least one of a plurality of second transistors, an adjustment voltage according to the logic difference;
    adjusting a transition voltage of a transition circuit of the detection circuit by the adjustment voltage,
    wherein the first logic state of the first signal is configured to be modified by the transition circuit to have a logic state the same as the second logic state.

16. The method of claim 15, further comprising:
determining, by a correction circuit, whether the first logic state of the first signal is the same as the second logic state of the second signal.

17. The method of claim 16, further comprising:
generating, by the detection circuit, an adjusted first signal after determining that the first logic state of the first signal is different from the second logic state.

18. The method of claim 15, wherein
generating, by a correction circuit, an enable signal when the first logic state of the first signal is different from the second logic state, to enable the coder circuit.

19. The method of claim 15, wherein adjusting the transition voltage comprises:
generating, by the coder circuit, a switch signal according to the logic difference,
wherein the plurality of first transistors and the plurality of second transistors are configured to be switched on or off in response to the switch signal.

20. The method of claim 19, further comprising:
decreasing the transition voltage when the first logic state of the first signal has a low logic value and the second logic state has a high logic value; and
increasing the transition voltage when the first logic state of the first signal has a high logic value and the second logic state has a low logic value.

* * * * *